(12) United States Patent
Hsieh

(10) Patent No.: US 11,092,383 B2
(45) Date of Patent: Aug. 17, 2021

(54) HEAT DISSIPATION DEVICE

(71) Applicant: ASIA VITAL COMPONENTS CO., LTD., New Taipei (TW)

(72) Inventor: Kuo-Chun Hsieh, New Taipei (TW)

(73) Assignee: Asia Vital Components Co., Ltd., New Taipei (TW)

(*) Notice: Subject to any disclaimer, the term of this patent is extended or adjusted under 35 U.S.C. 154(b) by 0 days.

(21) Appl. No.: 16/251,074

(22) Filed: Jan. 18, 2019

(65) Prior Publication Data

US 2020/0232712 A1 Jul. 23, 2020

(51) Int. Cl.
| | |
|---|---|
| *F28F 7/00* | (2006.01) |
| *F28D 1/03* | (2006.01) |
| *H01L 23/373* | (2006.01) |
| *F28D 20/00* | (2006.01) |
| *F28D 15/04* | (2006.01) |

(52) U.S. Cl.
CPC ............ *F28D 1/03* (2013.01); *F28D 15/046* (2013.01); *F28D 20/0056* (2013.01); *H01L 23/373* (2013.01)

(58) Field of Classification Search
CPC . F28D 1/03; F28D 1/00; F28D 15/046; F28D 20/0056; H01L 23/373
USPC ........................................................ 165/80.4
See application file for complete search history.

(56) References Cited

U.S. PATENT DOCUMENTS

| | | | | |
|---|---|---|---|---|
| 5,076,351 | A * | 12/1991 | Munekawa | ......... F28D 15/0283 165/104.21 |
| 9,453,688 | B2 * | 9/2016 | Yang | ..................... H01L 23/427 |
| 9,685,636 | B2 * | 6/2017 | Park | ...................... H01L 51/529 |
| 9,772,143 | B2 * | 9/2017 | Yang | ......................... F28F 1/32 |
| 10,012,445 | B2 * | 7/2018 | Lin | .......................... F28D 15/04 |
| 2005/0178532 | A1 * | 8/2005 | Meng-Cheng | ...... F28D 15/0233 165/104.33 |
| 2007/0012431 | A1 * | 1/2007 | Miyahara | ............ F28D 15/0233 165/170 |
| 2008/0251239 | A1 * | 10/2008 | Mochizuki | ............ H01L 23/427 165/104.33 |
| 2010/0006267 | A1 * | 1/2010 | Meyer, IV | .......... F28D 15/0233 165/104.26 |
| 2011/0088873 | A1 * | 4/2011 | Yang | .................... F28D 15/0233 165/104.26 |
| 2011/0174474 | A1 * | 7/2011 | Liu | ....................... F28D 15/046 165/185 |
| 2011/0186268 | A1 * | 8/2011 | Yang | ....................... F28D 15/02 165/104.26 |

(Continued)

FOREIGN PATENT DOCUMENTS

| | | |
|---|---|---|
| CN | 201119229 Y | 9/2008 |
| CN | 101819001 A | 9/2010 |

(Continued)

*Primary Examiner* — Claire E Rojohn, III

(74) *Attorney, Agent, or Firm* — Bradley J. Thorson; DeWitt LLP

(57) ABSTRACT

A heat dissipation device includes a main body and at least one heat conduction member. The main body has a top face. A periphery of the top face has a connection section. One end of the heat conduction member is correspondingly in contact and connection with the top face or the connection section. By means of the structure design of the present invention, the horizontal heat dissipation effect is greatly enhanced and the heat dissipation effect of the entire heat dissipation device is greatly enhanced.

6 Claims, 3 Drawing Sheets

(56) References Cited

U.S. PATENT DOCUMENTS

| | | | |
|---|---|---|---|
| 2011/0259554 A1* | 10/2011 | Yang | F28D 15/04 165/104.26 |
| 2012/0285662 A1* | 11/2012 | Meyer, IV | F28D 15/04 165/104.26 |
| 2013/0199757 A1* | 8/2013 | Meyer, IV | H05K 7/2029 165/104.26 |
| 2014/0138057 A1* | 5/2014 | Horng | F28D 15/046 165/104.26 |
| 2014/0182819 A1* | 7/2014 | Yang | F28D 15/04 165/104.26 |
| 2015/0083371 A1* | 3/2015 | Hsieh | G06F 1/20 165/104.26 |
| 2015/0129175 A1* | 5/2015 | Huang | F28D 15/04 165/104.21 |
| 2015/0185793 A1* | 7/2015 | Hsieh | G06F 1/203 361/679.54 |
| 2016/0003555 A1* | 1/2016 | Sun | F28D 15/0266 165/104.26 |
| 2016/0091259 A1* | 3/2016 | Lin | F28D 15/0233 165/104.26 |
| 2016/0131436 A1* | 5/2016 | Hsieh | F28D 15/04 165/104.26 |
| 2016/0131437 A1* | 5/2016 | Wu | F28D 15/04 165/104.26 |
| 2016/0187074 A1* | 6/2016 | Lin | F28F 9/007 165/67 |
| 2016/0219756 A1* | 7/2016 | Sun | F28D 15/0275 |
| 2016/0223267 A1* | 8/2016 | Hsieh | H01L 23/427 |
| 2017/0023307 A1* | 1/2017 | Wang | F28D 15/046 |
| 2017/0122671 A1* | 5/2017 | Lin | F28F 3/048 |
| 2017/0122672 A1* | 5/2017 | Lin | B23K 1/0012 |
| 2017/0153064 A1* | 6/2017 | Lan | F28D 15/046 |
| 2017/0248374 A1* | 8/2017 | Yang | F28D 15/046 |
| 2017/0254600 A1* | 9/2017 | Sun | F28D 15/046 |
| 2017/0268835 A1* | 9/2017 | Lin | F28D 15/0233 |
| 2017/0292793 A1* | 10/2017 | Sun | F28D 15/046 |
| 2017/0343298 A1* | 11/2017 | Lan | F28D 15/0266 |
| 2017/0367219 A1* | 12/2017 | Hsieh | G06F 1/203 |
| 2018/0031330 A1* | 2/2018 | Roberts | H01L 23/427 |
| 2018/0100708 A1* | 4/2018 | Hsieh | F28D 15/046 |
| 2018/0106552 A1* | 4/2018 | Lin | H05K 7/20336 |
| 2018/0164043 A1* | 6/2018 | Kurashima | F28D 15/0233 |
| 2018/0320997 A1* | 11/2018 | He | F28D 15/0283 |
| 2018/0372418 A1* | 12/2018 | Chiang | F28D 15/046 |
| 2018/0372419 A1* | 12/2018 | Liu | F28D 15/046 |
| 2018/0372431 A1* | 12/2018 | Chiang | F28F 21/086 |
| 2019/0145712 A1* | 5/2019 | Hsieh | F28D 15/0275 165/104.26 |
| 2019/0162480 A1* | 5/2019 | Shen | F28D 15/0275 |
| 2019/0204019 A1* | 7/2019 | Liu | F28F 3/12 |
| 2019/0204020 A1* | 7/2019 | Liu | F28D 15/0233 |
| 2019/0226770 A1* | 7/2019 | Cheng | F28D 15/04 |
| 2019/0242654 A1* | 8/2019 | Machida | F28D 15/0233 |
| 2019/0285357 A1* | 9/2019 | Sheng | F28D 15/046 |
| 2019/0343021 A1* | 11/2019 | Zhang | F28D 15/04 |
| 2019/0376747 A1* | 12/2019 | Cheng | F28D 15/046 |
| 2020/0025457 A1* | 1/2020 | Lin | H01L 23/427 |
| 2020/0045851 A1* | 2/2020 | Hsieh | F28D 15/0233 |
| 2020/0060044 A1* | 2/2020 | Numoto | H05K 7/20336 |
| 2020/0068745 A1* | 2/2020 | Lin | H05K 7/20172 |
| 2020/0088472 A1* | 3/2020 | Lin | F28D 15/046 |
| 2020/0232712 A1* | 7/2020 | Hsieh | F28D 1/03 |

FOREIGN PATENT DOCUMENTS

| | | |
|---|---|---|
| CN | 103025118 A | 4/2013 |
| CN | 205678635 | 11/2016 |
| CN | 107407531 A | 11/2017 |
| CN | 108362144 A | 8/2018 |
| CN | 108362148 A | 8/2018 |
| CN | 108716871 A | 10/2018 |
| CN | 108882644 A | 11/2018 |
| CN | 209639571 U | 11/2019 |
| TW | 201102605 A | 1/2011 |

* cited by examiner

HEAT DISSIPATION DEVICE

BACKGROUND OF THE INVENTION

1. Field of the Invention

The present invention relates generally to a heat dissipation device, and more particularly to a heat dissipation device, which can greatly enhance the horizontal heat dissipation effect as a whole.

2. Description of the Related Art

A vapor chamber is a kind of heat dissipation device often applied to heat dissipation field. The vapor chamber is often made of copper, aluminum, stainless steel, etc. In manufacturing, these materials are apt to cause potential difference, which will result in the phenomenon of potential difference corrosion, etc. In addition, in the case that the conventional vapor chamber made of copper, aluminum or stainless steel is applied to large-scale industrial equipment, in order to have sufficient strength, the vapor chamber generally has a huge volume and quite heavy weight. In the case that the vapor chamber is applied to a handheld device such as an intelligent mobile phone or tablet, it is necessary to manufacture an extremely thin vapor chamber. Under such circumstance, the vapor chamber is often too thin to have sufficient strength. Therefore, in recent years, some manufacturers have manufactured advanced heat dissipation devices with titanium material for application to heat dissipation field.

Titanium is a metal material having the properties of lightweight, high structural strength and anticorrosion. Therefore, titanium has been widely used in various fields. However, in comparison with copper and aluminum materials, the thermal conductivity (also referred to as K value) of titanium is slightly lower than that of copper and aluminum materials. In addition, the heat dissipation device made of titanium has a relatively poor heat conduction effect in horizontal direction.

Please refer to FIGS. 1A and 1B. Some manufacturers manufacture a heat dissipation device 1 (such as a vapor chamber) with titanium and additionally attach at least one heat conduction member 11 (such as graphite sheet, heat pipe, copper plate, etc.) to the outer flange 10 of the heat dissipation device 1 so as to enhance the heat conduction effect in horizontal direction. The flange 10 is a section formed along the outer peripheries of the two plate bodies in such a manner that after two plate bodies of the vapor chamber are mated with each other, the outer peripheries of the two plate bodies are connected and sealed with each other by means of heating (such as welding) or pressurization. In addition, the working fluid 13 filled in the vapor chamber cannot flow to the flange 10 so that the flange 10 is a void area without vapor-liquid circulation effect. The conventional vapor chamber is simply improved by means of attaching the heat conduction member 11 to the flange 10 of the vapor chamber without directly contacting the working area of the vapor chamber with heat conduction effect, (that is, the area of the chamber 12 with the vapor-liquid circulation effect of the working fluid 13 as shown in FIG. 1B). Therefore, actually, the heat conduction member 11 additionally attaching to the flange 10 can hardly enhance the heat conduction effect in horizontal direction. As a result, the heat dissipation effect of the entire heat dissipation device 1 cannot be enhanced.

It is therefore tried by the applicant to provide a heat dissipation device, which can greatly enhance the horizontal heat dissipation effect to improve the shortcoming of the conventional heat dissipation device.

SUMMARY OF THE INVENTION

It is therefore a primary object of the present invention to provide a structure, which can greatly enhance the heat dissipation effect of the heat dissipation device in horizontal direction.

To achieve the above and other objects, the heat dissipation device of the present invention includes a main body and at least one heat conduction member. The main body has a top face. One end of the heat conduction member is correspondingly in contact and connection with the top face.

Still to achieve the above and other objects, the heat dissipation device of the present invention includes a main body and at least one heat conduction member. The main body has a top face. A periphery of the top face has a connection section. One end of the heat conduction member is correspondingly in contact and connection with the top face or the connection section.

It should be noted that the main body has an upper plate and a lower plate. The upper and lower plates are correspondingly mated with each other to together define a chamber. A working fluid is filled in the chamber. The chamber is an area where the vapor-liquid circulation of the working fluid is performed. The main body is further formed with a flange, which is an outermost periphery of the main body for connection and sealing of the main body. Therefore, the flange is a void area without vapor-liquid circulation effect.

By means of the structure design of the present invention, one end of the heat conduction member extends to contact and connect with the top face or the connection section. One face of the heat dissipation device is in contact with and attaches to a heat source to absorb the heat thereof. At this time, the vapor-liquid circulation of the working fluid in the chamber is performed so as to conduct and dissipate the heat. Also, the heat can be transferred from one end to the other end of the heat conduction member in contact with and attached to the top face or the connection section so as to enhance the heat conduction and dissipation effect in the horizontal direction. Accordingly, the horizontal heat conduction and dissipation effect of the heat dissipation device is greatly enhanced to improve the shortcoming of the conventional heat dissipation effect that the heat conduction member is simply attached to the flange of the main body and fails to achieve any heat transfer effect.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENTS

Figure 1A:
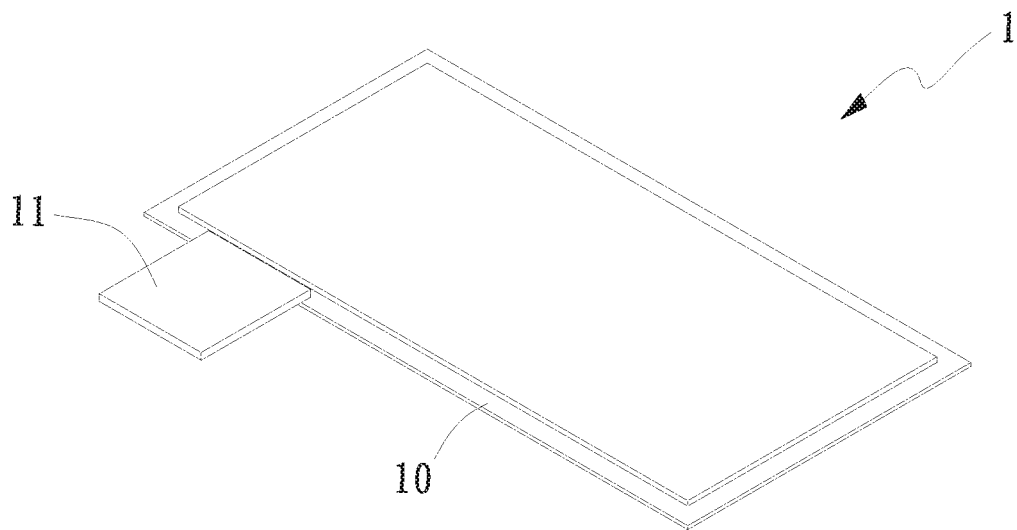
FIG. 1A is a perspective assembled view of a conventional heat dissipation device.
Figure 1B:
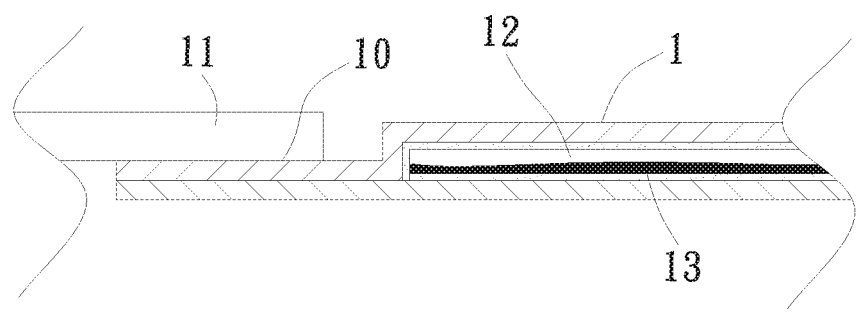
FIG. 1B is a sectional view of the conventional heat dissipation device.
Figure 2:
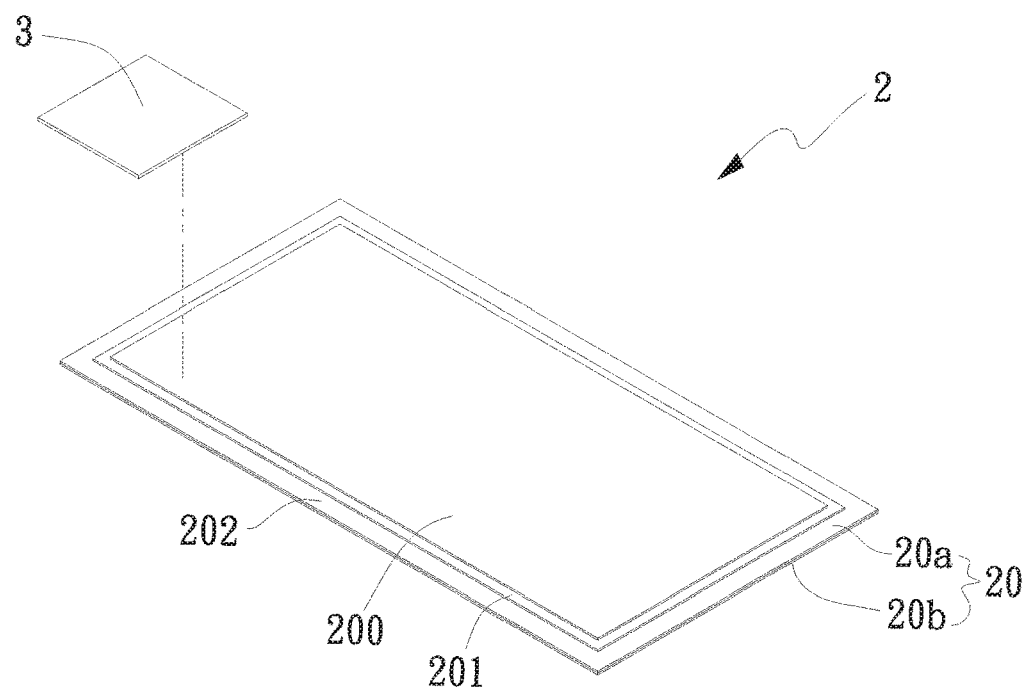
FIG. 2 is a perspective exploded view of a first embodiment of the heat dissipation device of the present invention.
Figure 3:
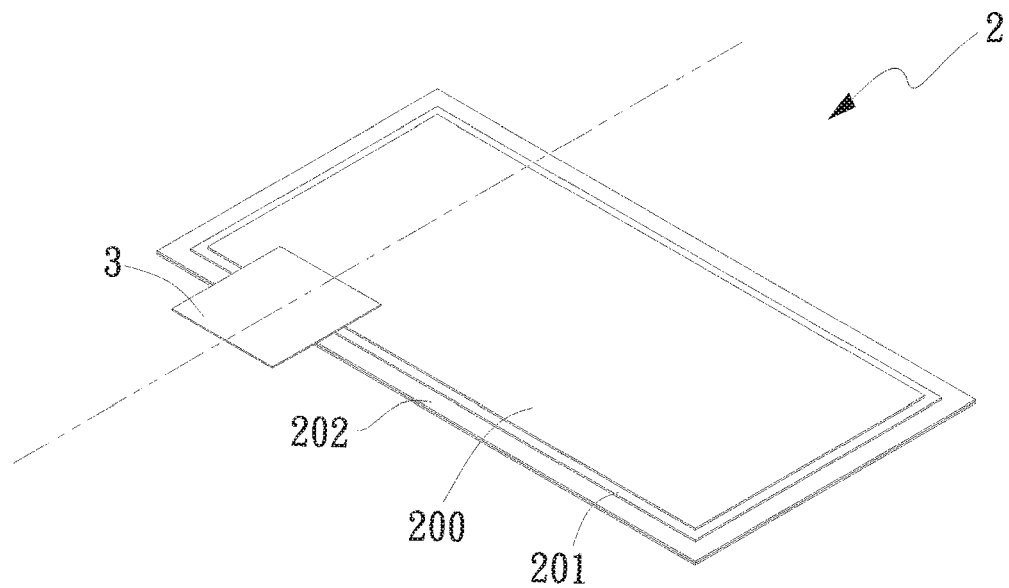
FIG. 3 is a perspective assembled view of the first embodiment of the heat dissipation device of the present invention.
Figure 4:
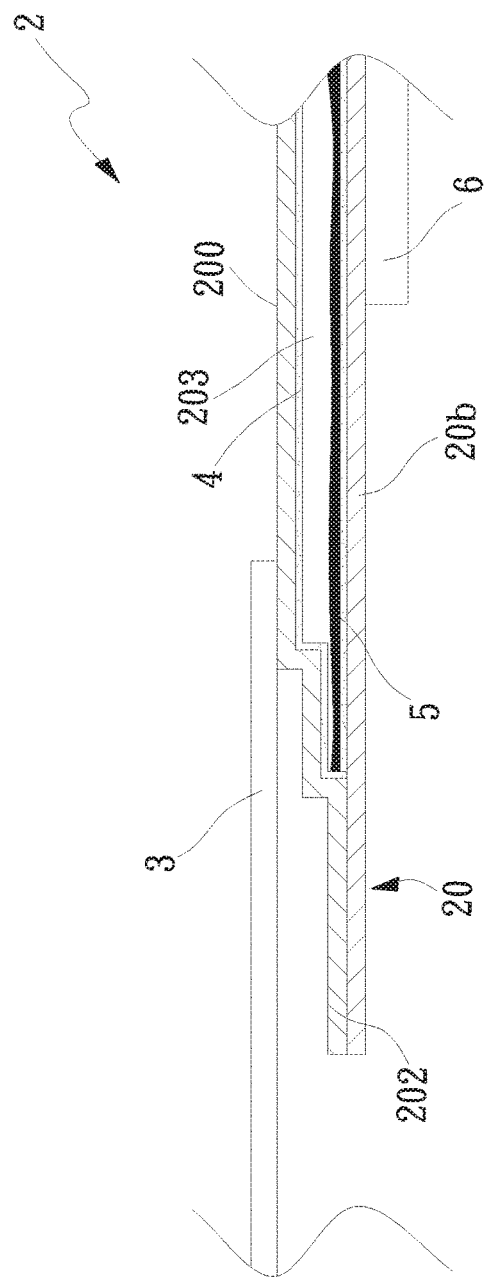
FIG. 4 is a sectional view of the first embodiment of the heat dissipation device of the present invention.

Please refer to FIGS. 2, 3 and 4. FIG. 2 is a perspective exploded view of a first embodiment of the heat dissipation device of the present invention. FIG. 3 is a perspective assembled view of the first embodiment of the heat dissipation device of the present invention. FIG. 4 is a sectional view of the first embodiment of the heat dissipation device of the present invention. The first embodiment of the heat dissipation device 2 of the present invention includes a main body 20 and at least one heat conduction member 3. The main body 20 has a top face 200. A periphery of the top face 200 has a connection section 201. In this embodiment, the main body 20 is, but not limited to, a vapor chamber for illustration purposes. Alternatively, the main body 20 can be a heat pipe, a heat plate or any other heat dissipation device.

The main body 20 has an upper plate 20a and a lower plate 20b. The upper and lower plates 20a, 20b are correspondingly mated with each other to together define a chamber 203. The top face 200 and the connection section 201 are respectively correspondingly disposed on an outer side of the chamber 203. A capillary structure 4 and a working fluid 5 are disposed in the chamber 203. The upper and lower plates 20a, 20b can be made of the same material or different materials and are assembled with each other to form the main body 20. The material of the upper and lower plates 20a, 20b is selected from a group consisting of gold, silver, copper, aluminum, iron, stainless steel, ceramic material, commercial pure titanium and titanium alloy. An outer face of the upper plate 20a, (that is, the top face) is defined as a condensation side, while an outer face of the lower plate 20b, (that is, the bottom face) is defined as a heat absorption side.

In this embodiment, one end of the heat conduction member 3 is correspondingly in contact and connection with the top face 200. The heat conduction member 3 is selectively graphite or graphene. The heat conduction member 3 is correspondingly in contact with and attaches to the top face 200 by means of adhesion, diffusion bonding, welding, sintering or laser welding.

It should be noted that the working fluid 5 in the chamber 203 is positioned where the vapor-liquid circulation is performed. In addition, the main body 20 is further formed with a flange 202 as an outermost periphery of the main body 20 for connection and sealing of the main body 20. Therefore, the flange 202 is a void area without vapor-liquid circulation effect.

Please further refer to FIG. 4. According to the structural design of the present invention, the outer face of the lower plate 20b, (that is, the heat absorption side) of the heat dissipation device 2 is in contact with and attaches to a heat source 6 to absorb the heat thereof. At this time, the vapor-liquid circulation of the working fluid in the chamber 203 is performed so as to conduct and dissipate the heat. Also, the heat can be transferred from one end to the other end of the heat conduction member 3 attached to the top face 200 so as to enhance the heat conduction and dissipation effect in the horizontal direction of the main body 20. The other end of the heat conduction member 3 can be further connected to a heat dissipation component (not shown) to dissipate the heat. The heat dissipation component can be a heat sink or a radiating fin assembly. Accordingly, the heat dissipation effect of the entire heat dissipation device 2 of the present invention can be greatly enhanced to improve the shortcoming of the conventional heat dissipation device that the heat conduction member 3 is simply attached to the flange 202 of the main body 20 and fails to achieve any heat transfer effect.

In addition, it should be noted that the number and size of the heat conduction member 3, one end of which is in contact and connection with the top face 200 are not limited. The number and size of the heat conduction member 3 can be adjusted in accordance with the requirement of a user for the arrangement.

Figure 5:
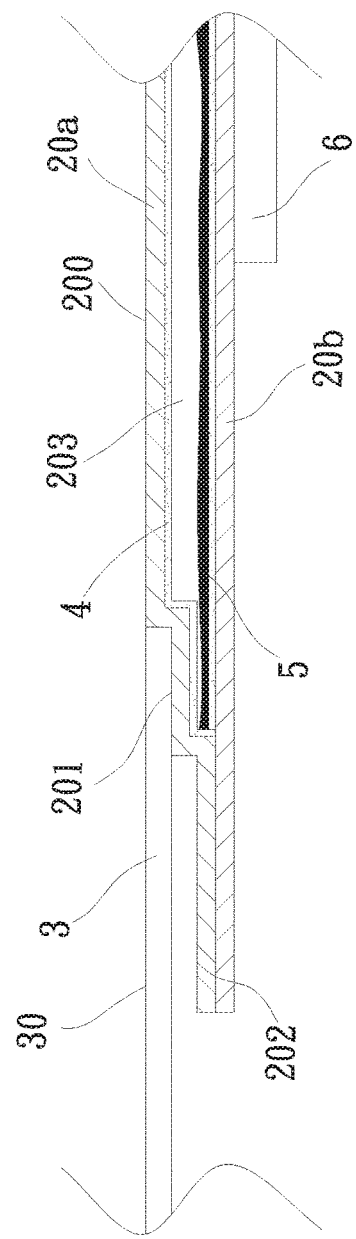
FIG. 5 is a sectional view of a second embodiment of the heat dissipation device of the present invention.

Please now refer to FIG. 5, which is a sectional view of a second embodiment of the heat dissipation device of the present invention. The second embodiment is partially identical to the first embodiment in structure and thus will not be redundantly described hereinafter. The second embodiment is different from the first embodiment in that one end of the heat conduction member 3 is correspondingly in contact and connection with the connection section 201. The connection section 201 has the form of a stepped structure. The flange 202 further outward extends from the stepped structure. The stepped structure is continuously arranged or discontinuously arranged. In this embodiment, as shown in the drawing, the stepped structure is continuously arranged. A first face 30 of the heat conduction member 3 is correspondingly flush with the top face 200 of the main body 20 (as shown in FIG. 5). Alternatively, the first face 30 of the heat conduction member 3 is not flush with the top face 200 of the main body 20, that is, the first face 30 is selectively lower than or higher than the top face 200 (not shown).

In conclusion, in comparison with the conventional heat dissipation device, the present invention has the following advantages:

1. The horizontal heat conduction and dissipation effect is greatly enhanced.
2. The heat dissipation effect of the entire heat dissipation device is greatly enhanced.

The present invention has been described with the above embodiments thereof and it is understood that many changes and modifications in such as the form or layout pattern or practicing step of the above embodiments can be carried out without departing from the scope and the spirit of the invention that is intended to be limited only by the appended claims.

What is claimed is:

1. A heat dissipation device comprising:
a main body including an upper plate having a top face and a lower plate, a stepped portion being defined at a periphery of the top face and having two tiers, a connection section being a first tier formed on the periphery of the top face and below the top face, a flange being a second tier formed at a part where the upper plate is directly attached to and in contact with the lower plate, the upper and lower plates being mated with each other to define a chamber, wherein the top face and the connection section are located outside of the chamber and over the chamber, and the flange is not over the chamber; and
at least one heat conduction member extending horizontally outward from the main body, one end of the heat conduction member being in contact and in thermal connection with the top face over the chamber or the first tier.

2. The heat dissipation device as claimed in claim 1, wherein the upper and lower plates are made of a same material or different materials.

3. The heat dissipation device as claimed in claim 1, wherein the upper and lower plates are made from commercial pure titanium or titanium alloy.

4. The heat dissipation device as claimed in claim 1, wherein the upper plate is defined as a condensation side, while the lower plate is defined as a heat absorption side.

5. The heat dissipation device as claimed in claim 1, wherein the heat conduction member is selected from a group consisting of graphite, graphene, heat pipe and copper plate.

6. The heat dissipation device as claimed in claim 1, wherein the heat conduction member is correspondingly in contact with and attaches to the top face by means of adhesion, diffusion bonding, welding, sintering or laser welding.

\* \* \* \* \*